(12) United States Patent
Greulich-Weber

(10) Patent No.: US 10,260,163 B2
(45) Date of Patent: Apr. 16, 2019

(54) DEVICE AND METHOD FOR PRODUCING SILICON CARBIDE

(71) Applicant: Universität Paderborn, Paderborn (DE)

(72) Inventor: Siegmund Greulich-Weber, Bad Lippspringe (DE)

(73) Assignee: Universität Paderborn, Paderborn (DE)

( * ) Notice: Subject to any disclaimer, the term of this patent is extended or adjusted under 35 U.S.C. 154(b) by 0 days.

(21) Appl. No.: 15/542,039

(22) PCT Filed: Dec. 23, 2015

(86) PCT No.: PCT/EP2015/081185
§ 371 (c)(1),
(2) Date: Jul. 6, 2017

(87) PCT Pub. No.: WO2016/110418
PCT Pub. Date: Jul. 14, 2016

(65) Prior Publication Data
US 2018/0002829 A1 Jan. 4, 2018

(30) Foreign Application Priority Data
Jan. 6, 2015 (DE) .................. 10 2015 100 062

(51) Int. Cl.
C30B 25/02 (2006.01)
C30B 25/00 (2006.01)
(Continued)

(52) U.S. Cl.
CPC ............... *C30B 25/00* (2013.01); *B01J 19/02* (2013.01); *B01J 19/18* (2013.01); *C01B 32/956* (2017.08); *C23C 16/325* (2013.01); *C30B 29/36* (2013.01); *C30B 29/66* (2013.01); *D01F 9/08* (2013.01); *B01J 2219/00135* (2013.01); *B01J 2219/0227* (2013.01); *C01P 2004/10* (2013.01)

(58) Field of Classification Search
CPC .......... C30B 25/02; C30B 23/02; C30B 23/10
See application file for complete search history.

(56) References Cited

U.S. PATENT DOCUMENTS 3,343,920 A    9/1967  Lowe
4,288,495 A *  9/1981  Terner .................. B23B 27/148
                                                          423/345
(Continued)

FOREIGN PATENT DOCUMENTS

DE    69518071 T2    3/2001
EP    0756580 B1     11/1995
(Continued)

OTHER PUBLICATIONS

Notification of Transmittal of Translation of the International Preliminary Report on Patentability for PCT/EP2015/081185; dated Jul. 11, 2017; 8 pages.
(Continued)

*Primary Examiner* — Robert M Kunemund
(74) *Attorney, Agent, or Firm* — Reising Ethington, P.C.

(57) ABSTRACT

The disclosure relates to a device for continuously producing qualitatively high-grade crystalline silicon carbide, in particular in the form of nanocrystalline fiber.

9 Claims, 1 Drawing Sheet

(51) Int. Cl.
  *D01F 9/08* (2006.01)
  *B01J 19/02* (2006.01)
  *B01J 19/18* (2006.01)
  *C01B 32/956* (2017.01)
  *C23C 16/32* (2006.01)
  *C30B 29/36* (2006.01)
  *C30B 29/66* (2006.01)

(56) References Cited

U.S. PATENT DOCUMENTS 4,702,901 A * 10/1987 Shalek .................. C30B 25/005
                                                    423/345
5,126,112 A     6/1992 Burgie
2008/0305031 A1  12/2008 Kim et al.

FOREIGN PATENT DOCUMENTS

JP   2010013319 A    1/2010
RU      2296827 C1   4/2007
WO   2004111316 A1  12/2004

OTHER PUBLICATIONS

International Search Report for PCT/EP2015/081185; dated Mar. 30, 2016; 4 pages.
English Translation of International Search Report for PCT/EP2015/081185; dated Mar. 30, 2016; 2 pages.

* cited by examiner

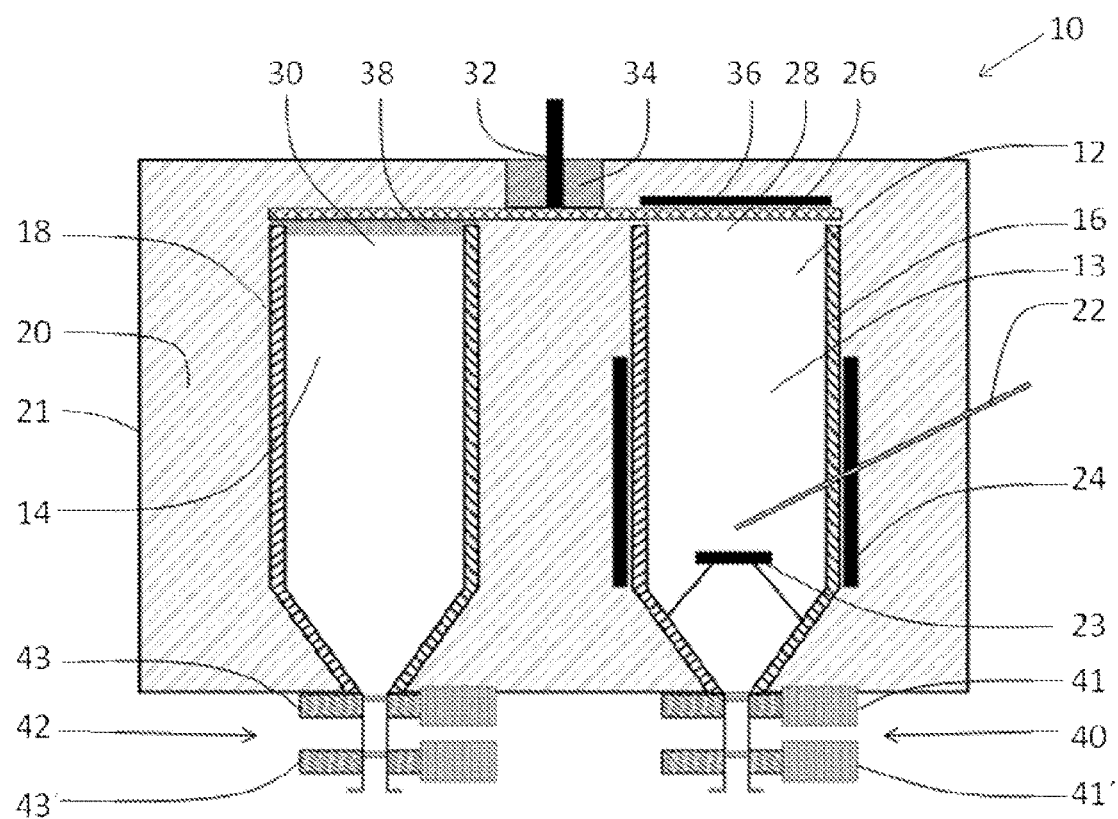

DEVICE AND METHOD FOR PRODUCING SILICON CARBIDE

CROSS-REFERENCE TO RELATED APPLICATIONS

The present application is the US national phase of PCT application no. PCT/EP2015/081185, which was filed on Dec. 23, 2015 and titled "DEVICE AND METHOD FOR PRODUCING SILICON CARBIDE", which claims priority from German Patent application no. DE 10 2015 100 062.8, which was filed on Jan. 6, 2015 and titled "DEVICE AND METHOD FOR PRODUCING SILICON CARBIDE".

TECHNICAL FIELD

The present disclosure relates to a device and a method for producing crystalline silicon carbide, in particular nanostructured crystalline silicon carbide.

BACKGROUND

Silicon carbide is preferred for a variety of applications. Thus, for example, it is known to use silicon carbide as an electrode material for batteries such as lithium-ion batteries. The preparation of crystalline silicon carbide, in particular in the nano- or microcrystalline scale, is a complex process which requires precise control in order to produce defined silicon carbide in the form of nanocrystalline fibers.

In principle, a plurality of devices are known for the production of fibers. For example, the documents RU 2296827, RU 2389836 and RU 2409711 describe reactors for the production of carbon fibers. These documents disclose that the fibers are deposited at a disc and removed therefrom by means of a scraper. Here, however, in particular discontinuous processes are used.

The document JP2013049599 describes a device for producing carbon nano coils comprising a reactor for forming the nano coils. The nano coils produced can pass through an opening means into a collection container.

The documents WO 02/30816 and JP2005171443 A each disclose reactors for producing carbon fibers in which the fibers are formed on a substrate within a reactor and are scraped off from the substrate within the reactor to be accumulated in the reactor.

From document WO 01/16414 A1 further a device for producing carbon fibers is known in which the carbon fibers are produced in a reactor.

The document DE 691 19 838 T2 describes a device for producing thin carbon fibers. This device is based on a preparation of the fibers by vapor phase pyrolysis. In this case a conveying means is provided on which components necessary for the fiber production are conveyed through a furnace in order to form the fibers.

The document JP 09143717 A describes a device for vacuum vapor deposition. In this device substrates are to be coated directly which are to be fixed automatically to a rotating disc or released therefrom.

From the documents WO 2009/029341 A2 and U.S. Pat. No. 8,246,886 B2, moreover, devices for processing carbon nanotubes are known. In these devices already existing nanotubes are further processed, however, a device for producing carbon nanotubes is not described in these documents.

From document US 2009/0053115 A1 a device for producing aligned carbon nanotubes is known. By use of this reactor substrates are transported through a reactor on which nanotubes are grown.

However, none of the above described documents is directly related to the production of crystalline silicon carbide, especially in the form of nanocrystalline fibers, so that the devices of the above cited prior art are to be associated to a foreign technical field and do not seem to be suited for the production of silicon carbide, especially in nanocrystalline fibrous form.

SUMMARY

It is therefore one object of the present disclosure to provide a measure by which in a cost effective manner a continuous production of silicon carbide, in particular in the form of nanocrystalline fibers, is enabled.

This one object is achieved according to the disclosure by a device including the recitations of claim 1. The one object is further achieved by a method including the recitations of claim 10. Preferred embodiments are disclosed in the dependent claims, in the description, in the FIGURE and in the example, wherein further features described or shown in the dependent claims or in the description or in the FIGURE or in the example individually or in any combination can be a subject matter of the invention, unless otherwise the contrary is obvious from the context.

The present disclosure relates to a device for continuously producing crystalline silicon carbide, comprising
a reactor; and
a collection container at least partially spatially separated from the reactor, wherein
the reactor comprises a supply means for supplying a precursor mixture,
a substrate for depositing crystalline silicon carbide is provided,
a reaction space of the reactor can be temperature-controlled to a first temperature $T_1$ and the substrate can be temperature-controlled to a second temperature $T_2$ which is different from the first temperature $T_1$, wherein the reactor can be heated to a temperature in a range of $\geq 1400°$ C. to $\leq 2000°$ C., and wherein the temperature of the substrate can be reduced by a temperature in a range of $\geq 50°$ C. to $\leq 100°$ C. compared to the temperature basically set in the reactor in the aforementioned range of $\geq 1400°$ C. to $\leq 2000°$ C., wherein
the substrate for the deposition of crystalline silicon carbide can be disposed at a deposition position within or adjacent to the reaction chamber and at least area-wise be moved from the deposition position to the collection container, and wherein
a scraper is arranged such that after or during an at least area-wise movement of the substrate to the collection container crystalline silicon carbide deposited on the substrate can be removed by the scraper from the substrate and the removed crystalline silicon carbide can be transferred into the collection container.

Such a device enables in a simple and cost-efficient manner a defined and continuous production of high-grade silicon carbide, in particular in the form of nanocrystalline fibers.

The above described device may be used for producing crystalline silicon carbide and in particular for producing or preparing nanostructured silicon carbide in fiber form. For producing such a product in particular a device is required in which by setting highly defined conditions in a particularly reproducible way crystals of the silicon carbide can be produced in the form of fibers.

The device comprises a reactor and a collection container which is at least partially spatially separated from the reactor. Thus, in a device described above at least two compartments or containers are provided which are at least partially, in particular completely, spatially separated. This in the sense of the present disclosure may mean in particular, that a spatial separation, such as a wall or the like, is provided between the two containers or volumes, and thus not only separate areas of a common container but in particular completely separate volumes are provided. Thus, it is possible that inside the reactor and inside the collection container different conditions, such as in particular different temperatures and/or pressures, can be provided. For example thermal insulations between the reactor and the collection container may be provided to enable or improve these conditions.

In order to produce silicon carbide the reactor comprises a supply means for supplying a precursor mixture. Herein, the precursor mixture serves in particular as a starting material for the silicon carbide to be produced and may, in addition to the educts, comprise a catalyst, a dopant or the like, as will be described below in detail with reference to the method.

The present device is based in particular on at least partially passing the precursor mixture into the gas phase and to be able to deposit the desired product onto a substrate. Accordingly, a substrate for the deposition of crystalline silicon carbide is provided in an above-described device. Thus, the substrate serves as a deposition surface on which silicon carbide can be deposited in a crystalline form. Accordingly, the substrate for the deposition of crystalline silicon carbide can be disposed in a deposition position within or adjacent to the reactor or the reaction chamber. This in particular means that the substrate and thus at least a part of the substrate can be disposed such that the gas phase, in which the starting material or the starting materials for the formation of silicon carbide are arranged, can come into contact with the substrate.

In order to ensure a deposition of the silicon carbide from the gas phase, it is advantageous in some embodiments that the temperature in the reactor and the temperature of the substrate are different from each other. In detail, it may be preferable that inside the reactor or in the reaction chamber of the reactor a sufficiently high temperature is present to bring the corresponding substances into the gas phase or to keep them in the gas phase. Thus, the reaction chamber is in particular the volume in which the starting materials of the silicon carbide production pass into the gas phase or remain in the gas phase. In order to enable the desired deposition or crystallisation it may be further advantageous in some embodiments that the substrate has a temperature which is reduced compared to the temperature in the reaction chamber. In other words, it is of advantage in some embodiments for the deposition of the silicon carbide crystals that the inside of the reactor can be temperature-controlled to a first temperature $T_1$ and the substrate can be temperature-controlled to a second temperature $T_2$, wherein $T_2$ is preferably smaller than $T_1$, wherein the reactor can be heated to a temperature in a range of $\geq 1400°$ C. and $\leq 2000°$ C., and wherein the temperature of the substrate can be reduced by a temperature in a range of $\geq 50°$ C. to $\leq 100°$ C. compared to the temperature basically set in the reactor in the aforementioned range of $\geq 1400°$ C. and $\leq 2000°$ C.

Herein, by means of the above described adjustability of the temperature it may further be enabled that the produced silicon carbide is nanocrystalline and in detail a cubic 3C-structure of the silicon carbide is obtained. In particular, when the silicon carbide (SiC) is present as a silicon carbide single crystal, preferably in the form of monocrystalline cubic 3C—SiC, the monocrystalline silicon carbide fibers provide a high thermal conductivity. Thus, by means of the targeted adjustability of a temperature gradient between the reactor and the substrate it may be enabled that crystalline silicon carbide is deposited.

In particular, in some embodiments in order to enable a continuous process it is provided in the above-described device that the substrate is at least area-wise movable from the reactor or from its deposition position to the collection container. This in the sense of the present disclosure in particular means that the substrate at least area-wise, i.e., at least a portion thereof, can be moved to a position at or adjacent to the collection container so that deposited silicon carbide can be transferred into the collection container. This allows the silicon produced to be collected or stored in the collection container. This can be particularly advantageous in some embodiments when the substrate or a plurality of substrates are provided or arranged such that it is simultaneously enabled that silicon carbide is deposited on the or on one substrate and that further from another position of the substrate or another substrate silicon carbide which has already formed is separated and transferred into the collection container. In this configuration, silicon carbide can be produced preferably without a significant break and thus continuously under defined conditions. This only requires that the precursor mixture is introduced into the reactor continuously or discontinuously in a sufficient amount.

From the foregoing, it is further apparent that the provision of a reactor and a collection container which is at least partially spatially separated from the reactor is advantageous in some embodiments since the silicon carbide formed can easily be stored at relatively low temperatures, while at the same time silicon carbide can be formed in the reactor.

In the present device it is further provided that a scraper which may be fixed or immovable is provided, and therefore, that exactly one or a plurality of scrapers is provided. The scraper is in particular configured or arranged so that silicon carbide formed on the substrate can be removed or can be scraped off from the substrate by the scraper.

For this purpose, the scraper is arranged in particular at or adjacent to the collection container so that crystals removed by the scraper can be transferred into the collection container. In other words, the scraper is arranged such that after an at least partial movement of the substrate to the collection container crystalline silicon carbide deposited on the substrate can be removed from the substrate by the scraper and the removed crystalline silicon carbide can be transferred into the collection container.

A device described above allows a continuous and therefore effective and economical process of producing silicon carbide, in particular in the form of nanocrystalline fibers. Thus, silicon carbide can be produced particularly cost-effective and yet of high quality.

The cost-effectiveness, for example, may be enabled in that the device has a relatively simple and inexpensive construction and can be manufactured in a simple way. For example, it is not necessary to operate the device under vacuum, but it is possible to work with a slight inert gas over pressure such that high-temperature or vacuum seals as well as a vacuum pump can be dispensed with.

Furthermore, the device described above has the advantage in some embodiments that it allows the production of extremely high-grade silicon carbide because very defined conditions can be set. The set parameters not only can be set in a defined way but are also easily adaptable to the desired application so that moreover not only high quality but also particularly adaptable or variable silicon carbide crystals can be produced. The parameters to be set here include, for example, the selected temperature within the reactor or in the reaction chamber and the selected temperature of the substrate, including the selected temperature gradient between the reaction chamber and the substrate, and further the speed of movement of the substrate from the deposition position to the collection container, such as in a continuously movement, or the dwell time of the substrate in the deposition position, or the added amount of the precursor mixture per unit time.

By means of an appropriate selection of the above described parameters, for example, the properties of the produced silicon carbide crystals such as the diameter of produced crystalline fibers, their length and crystalline quality can be adjusted in a simple and defined manner.

In one preferred embodiment it can be provided that the substrate is formed as a rotatable disc. In particular, in this embodiment it may be allowed in a simple manner that a continuous process can be realized. This is due to the fact that a portion of the rotatable disc can always be arranged in or adjacent to the reactor or its reaction chamber, i.e., in the deposition position, whereas another portion may be arranged adjacent to the collection container. Thereby, even with a continuously rotating disc silicon carbide can permanently be deposited or generated while previously generated silicon carbide can be simultaneously removed by the scraper and transferred to the collection container. Here, moreover a simple adjustment to the desired silicon carbide to be produced is possible since the rotational speed of the disc is a parameter which can be set in a simple and defined way. This may be in particular the case when the disc rotates around its disc axis.

It may further be preferred that the scraper is disposed adjacent to a fall in opening of the collection container such that the crystalline silicon removed from the substrates falls into the collection container. A fall in opening in particular may be understood as such an opening, which is arranged such that the silicon carbide scraped off may fall into the collection container through the fall in opening. In this configuration, in turn, a particularly simple configuration may be enabled since only the scraper needs to be arranged as desired and otherwise a continuous and error-free operation may be guaranteed since the silicon carbide can be transferred into the collection container simply by taking advantage of the gravity.

In one further advantageous embodiment it may be provided that the reactor and the collection container are designed as top side open containers, wherein the substrate can be disposed above top-side openings of the reactor and the collection container. This configuration, in turn, can be realized very easily because no high demands are placed with respect to contacting the precursors present in the gas phase with the substrate as well as with respect to an opening of the collection container or the positioning of the scraper in order to transfer the silicon carbide removed from the substrate into the collection container. Rather, the process can be performed in a simple manner and under defined conditions.

In one further advantageous embodiment it may be provided that a wall of the reactor comprises graphite, for example, consists of graphite. In particular, in this embodiment the reactor at the one hand can be configured cost-efficient and on the other hand can well withstand high temperatures without being damaged or destroyed for example by atmospheric oxygen. Thus, in this embodiment a particularly long service life of the device can be enabled.

It may be particularly preferable in some embodiments if the wall of the reactor is at least partially constructed from a wound graphite foil, for example, consists thereof. In this embodiment, the device may be particularly durable, since it has turned out surprisingly that the wall can withstand a temperature change particularly well. During operation it often cannot be completely excluded that the graphite of the wall, which independently of the material can be configured for example as a cylinder, is converted into silicon carbide. The different coefficients of thermal expansion of graphite and silicon carbide can thereby lead to thermal stresses, which in a wound wall of a graphite foil can be released particularly easily and without any problems or do not occur or only occur in a reduced form. This, in turn, allows a particularly long service life of the wall and thus of the device.

In one further advantageous embodiment it can be provided that the scraper is at least partially constructed of silicon carbide, for example consists of silicon carbide. In this embodiment a particularly high-grade crystalline silicon carbide can be produced, since the scraper does not introduce impurities into the silicon carbide scraped off. This may be of advantage in particular since nanocrystalline silicon carbide is produced.

In one further advantageous embodiment it can be provided that a tempering means for tempering the reactor is provided and that a further tempering means for tempering the substrate is provided, wherein the tempering means for tempering the reactor and the tempering means for tempering the substrate can be controlled separately from each other. In this embodiment, by separately controlling the tempering means a temperature gradient between the gas volume in the reactor and the substrate can be set in a particularly defined way. For example, two tempering means can be provided, one of which may temper the wall of the reactor, in particular heat the wall of the reactor, and a further tempering may be provided which acts on the substrate, for example from a side opposite from the reactor or from a side opposite from the deposition surface of the substrate, in order to be able to set the corresponding temperatures. In this embodiment, thus, particularly defined conditions can be set and in turn particularly high-grade and defined silicon carbide can be produced.

In one further advantageous embodiment it can be provided that the collection container and the reactor each comprise a material lock for discharging a solid material.

By the provision of appropriate material locks, such as solid material locks, it is possible to remove the silicon carbide contained in the collection container from the collection container or to remove residues of the precursor mixture from the reactor during operation of the device. This enables to maintain a continuous process even over a long period.

With respect to further advantages and technical features of the device described above it is hereby explicitly referred to the description of the method and to the example, the FIGURE and the description of the FIGURE, and vice versa.

The present disclosure in one embodiment further relates to a method for producing crystalline silicon carbide by use of a device such as described in detail above, comprising the steps of:

a) introducing a precursor mixture including a silicon source, a carbon source and optionally a doping agent into the reactor;

b) exposing the precursor mixture provided in step a) to a gasification temperature in the reactor;

c) depositing crystalline silicon carbide at the substrate by adjusting a crystallization temperature at the substrate;

d) moving the substrate to the scraper; and e) transferring the silicon carbide produced into the collection container by removing the silicon carbide produced from the substrate by moving the substrate along the scraper.

By use of the method described above high-grade silicon carbide can be produced in a simple and defined manner. The aforementioned steps a) to e) can in principle be carried out in the order as named at least partially simultaneously or in an at least partially deviating sequence. In particular, a device as described above in detail is used for the method described above. With reference to the device, thus, it is referred to the above explanations.

Herein, the method in its entirety or individual of steps a) to e) may preferably be carried out under a protective gas, in particular argon or nitrogen. To this end, for example, a protective gas inlet can be provided at the reactor and/or at the collection container through which the reactor and/or the collection container may be filled with a protective gas and optionally be operated under a protective gas over pressure. Thus, the silicon carbide produced can further be removed from the collection container under protective gas.

According to method step a) the method includes inserting a precursor mixture including a silicon source, a carbon source and optionally a doping agent into the reactor or in particular into the reaction chamber of the reactor. Thus, the term precursor mixture in the sense of the present disclosure means in particular, that at least a silicon source and a carbon source are used in the precursor mixture, independently of their configuration, i.e., if the carbon source and the silicon source, for example, are present as different solids, as different substances in a solid or as solid particles, or are present in totally different forms.

The silicon source and the carbon source are used to enable the formation of silicon carbide by a reaction of the carbon source with the silicon source in the further process. Therefore, the silicon source and the carbon source should be selected such that they are able to form silicon carbide at the conditions described below, in particular at the following temperatures, for example at atmospheric pressure (1 bar) or a slight over-pressure, by the method described above.

The selection of the silicon source or the carbon source, thus, in principle is not restricted. For example, solid particles can be directly used which include carbon and silicon in each of the particles. These, for example, may be produced by a sol-gel process. For example, it may be preferred that a particle size in a range of $>10$ µm to $\leq 2$ mm, for example in a range of $\geq 25$ µm to $\leq 70$ µm is used in order to produce silicon carbide fibers. The fibers which can be produced by a method described above or in a device described above may, for example, have a diameter in a range of 10 nm to 3 µm and/or a length of a few millimeters, such as in a range of $\geq 1$ mm to $\leq 20$ mm.

Furthermore, inasfar a dopant is used and the dopant is not present in the solid granules comprising the carbon source and the silicon source and, thus, is transferred according to method step a) together with the solid granules into the reactor in which the heat treatment according to step b) takes place, the dopant can be introduced into the reactor, for example, as a gas, for example also by the supply means, wherein the mixture according to process step a) can be formed directly in the reactor prior to the temperature treatment. This may in particular be advantageous in some embodiments if the dopant can be provided as a gas. For example, in this case gaseous nitrogen can serve as a dopant.

With respect to the dopant it can be selected based on the desired doping. The dopant may also be part of the solid granulate. Alternatively, it is also conceivable that the doping of the forming silicon carbide, such as forming fibers or 3C silicon carbide nanocrystals, as described in detail below, is implemented during the thermal treatment via the gas phase in the reactor. As doping materials for an n-type doping preferably phosphorus (P) or nitrogen (N) may be used which is of considerable advantage for an electrode, whereas for a p-type doping boron (B) or aluminum (Al) may be used. Herein, by means of the doping a particularly good electrical conductivity of the electrode material can be set.

According to step b) the method further comprises subjecting the mixture in the reactor provided in step a) to a gasification temperature. In this step, the starting materials, thus, should be heated in such a way that they pass into the gas phase. For this purpose, the reactor or the reaction chamber may, for example, be heated to a temperature in a range from $\geq 1400°$ C. to $\leq 2000°$ C., in particular $\geq 1600°$ C., for example in a range from $\geq 1650°$ C. to $\leq 1850°$ C., preferably $\geq 1650°$ C. to about $\leq 1700°$ C., for example at atmospheric pressure (1 bar) or at a slight over pressure. In detail, for an adjustment of the temperature in step b) to a range described above nanostructured fibers of silicon carbide can be formed in a particularly advantageous manner in some embodiments. Here, the formation of a temperature gradient may be of advantage so that the precursor mixture can at least partially pass into the gas phase at a position that has a comparatively higher temperature, and silicon carbide fibers can be deposited at the relatively lower temperature, namely on the substrate. For example, the temperature of the substrate may be reduced by a temperature in a range of $\geq 50°$ C. to $\leq 100°$ C. compared to the temperature basically set in the reactor within the above mentioned range of $\geq 1400°$ C. to $\leq 2000°$ C., in particular $\geq 1600°$ C., for example in a range from $\geq 1650°$ C. to $\leq 1700°$ C.

By adjusting the temperature it may also be enabled that the produced silicon carbide is nanocrystalline and in detail a cubic 3C structure of the silicon carbide may be enabled. In particular, when the silicon carbide (SiC) is present as a silicon carbide single crystal, preferably as a monocrystalline cubic 3C—SiC, the monocrystalline silicon carbide fibers combine a high thermal conductivity. A nanostructured silicon carbide can be understood in particular as a silicon carbide, which in at least one dimension has a maximum spatial dimension in the nanometer range, in particular of less than or equal to 100 nm, wherein the lower limit can be restricted by the manufacturing process. In particular, the size of the particles of the solid granulate according to step a) may define the lower limit of the size of the particles of the silicon carbide, since here usually a size of 70% of the original size or the size of the particles of the solid granulate may be present, wherein the lower limit of the fibers may be determined by the temperature at the place of growth, the set temperature gradient and the growing time of the fibers.

Thus, by the controlled setting of a temperature gradient between the reactor and the substrate it may be enabled that crystalline silicon is deposited on the substrate by adjusting a crystallization temperature. Herein, by means of a controlled adjustment of the temperature in a range from $\geq 1400°$ C. to $\leq 2000°$ C., in particular $\geq 1600°$ C., for example in a range from $\geq 1650°$ C. to $\leq 1850°$ C., preferably $\geq 1650°$ C. to $\leq 1700°$ C., in the reactor and a temperature of the substrate which is reduced relatively by about ≥50° C. to ≤100° C. it is enabled that crystalline fibers of the silicon carbide are deposited. It can thus be seen that the crystallization temperature is lower than the gasification temperature and further that the gasification temperature may correspond to the above described first temperature $T_1$ and that the crystallization temperature may correspond to the above described second temperature $T_2$.

With respect to fibers, these may be in particular structures in which the ratio of length to diameter is at least greater than or equal to 3:1, such as greater than or equal to 10:1, in particular greater than or equal to 100:1, for example greater than or equal to 1000:1. For example, fibers having a diameter in a range of ≥10 nm to ≤3 µm and a length of a few millimeters, for example in a range ≥1 mm to ≤20 mm, can be specifically produced.

In accordance with steps d) and e) the method further comprises moving the substrate to the scraper and transferring the produced silicon carbide into the collection container by removing the produced silicon carbide from the substrate while moving the substrate along the scraper. These steps are used to remove the produced silicon carbide from the substrate and to collect and store it in the collection container in a continuous manner.

The properties of the produced fibers can be changed or adjusted in particular by the travel speed of the substrate or the crystallization duration at a portion of the substrate.

The aforementioned method may for example be adapted to produce silicon carbide fibers as an electrode material for a battery, such as in particular a lithium-ion battery. As explained above, the thermal management of the battery can be improved by the good thermal characteristics. Moreover, the chemical and thermal stability of the fibers can be of advantage in some embodiments for a long-term stability and the flexibility of the silicon carbide, in particular as fibers, can be of advantage in some embodiments for a high cycling stability. However, within the scope of the present disclosure also polycrystalline forms of silicon carbide are conceivable. A further advantage in some embodiments is that silicon carbide as an electrode material can have a high capacity so that an electrode material produced as described may further enable a good performance of a battery.

Further applications of the silicon carbide thus produced include areas of photonics, such as solar cells, as which corresponding differently doped silicon carbide fibres may act, LEDs, which, for example, may act as organic light emitting surfaces of light emitting textiles, which are based on silicon carbide, or structural reinforcements such as of other fibers.

The method is very effective, since in an exemplary device about 2000 m² can be produced in 24 h.

With respect to further advantages and technical features of the method described above it is hereby explicitly referred to the description of the device and to the example, the FIGURE and the description of the FIGURE, and vice versa.

BRIEF DESCRIPTION OF THE DRAWINGS

In the following the invention is described exemplarily with reference to the accompanying drawing and a preferred exemplary embodiment, wherein the features shown below both individually and in combination may constitute an aspect of the invention, and wherein the invention is not restricted to the following drawing, the following description and the following exemplary embodiment.

It shows:

FIG. 1 a schematic sectional view of a device according to an embodiment of the invention.

DETAILED DESCRIPTION

FIG. 1 is a schematic sectional view of a device 10 for continuously producing crystalline silicon carbide. The device 10 comprises a reactor 12 and a collection container 14 which is at least partially spatially separated from the reactor 12. The reactor 12 may comprise a wall 16 and the collection container 14 may comprise a wall 18, wherein the walls 16, 18 restrict the reactor 12 and the collection container 14, respectively. Moreover, the reactor 12 and the collection container 14 are surrounded by a matrix 20, wherein the matrix 20 may comprise or enable a protective gas over pressure and/or thermal insulations and/or tempering means, such as a water cooling. For example, the matrix 20 may be enclosed at the outside by a wall 21 such as a steel jacket.

Furthermore, for example, in a general but non-limiting direction from the outside to the inside, a water cooling, an insulation, such as comprising carbon fiber-reinforced carbon (carbon fiber carbon composite, CFC), graphite felt and graphite foam may be comprised by the matrix, wherein the walls 16, 18 can be contiguous with the graphite foam and/or the graphite felt. By providing the matrix 20 and in particular the wall 21 it can be enabled that the device 10 is thermally isolated and sealed with respect to its outer shell, the wall 21, so that the device 10 only needs to comprise the supply means 22 and the material locks 40, 42 as openings, as described below.

The wall 16 of the reactor 12 may comprise for example graphite or consist of graphite. For example, the wall 16 may at least partially, for example completely, be configured from a wound graphite foil. Exemplary wall thicknesses are for example in the range of ≥5 mm to ≤15 mm, such as 10 mm.

In order to transfer the starting materials for the silicon carbide production in the reactor 12 further the optionally closable supply means 22 for supplying a precursor mixture is provided. The supply means 22 may terminate, for example, in a reaction chamber 13 above a gasification plate 23, on which the precursor mixture can be placed and passes there into the gas phase by temperature influence.

For performing the reaction it is also provided that the inside of the reactor 12, i.e., in particular the reaction region 13 enclosed by the wall 16 or the gas volume provided therein, can be temperature-controlled to a first temperature $T_1$, the gasification temperature. For this purpose, a tempering means 24 for tempering the reactor 12 is provided. The tempering means 24 may be for example a heating element known per se.

In order to enable a deposition of silicon carbide, moreover a substrate 26 for the deposition of crystalline silicon carbide is provided, which can be placed within or adjacent to the reactor 12 or the reaction chamber 13 for depositing crystalline silicon carbide. According to FIG. 1 the substrate 26 is disposed above the reactor 12. In detail, it is shown that the reactor 12 and the collection container 14 are configured as top-side open containers, wherein the substrate 26 is disposed above top-side openings 28, 30 of the reactor 12 and the collection container 14. The area of the substrate 26 which is above the reactor 12 or above the opening 28 is thus disposed in the deposition position of the substrate 26.

It is further shown that the substrate 26 is formed as a rotatable disc. The substrate 26 can thus be moved at least area-wise from the reactor 12 to the collection container 14 by rotating the disc about the disc axis. Here, a rotation can take place for example by means of a rotary drive acting on a shaft 32, wherein said shaft 32 may be supported in a bearing 34. In order to enable a deposition of crystalline silicon carbide on the substrate 26, a further tempering means 36 for tempering the substrate 26 is provided, wherein the above described tempering means 24 for tempering the reactor 12 and the tempering means 36 for tempering the substrate 26 are controllable separately from each other. This enables tempering the substrate 26 to a second temperature $T_2$, the crystallization temperature, which is different from the first temperature $T_1$.

In FIG. 1, it is shown that an in particular fixed scraper 38 made for example of silicon carbide is disposed such that after or during an at least area-wise movement of the substrate 26 to the collection container 14 crystalline silicon carbide deposited on the substrate 26 can be removed by the scraper 38 from the substrate 16 and the removed crystalline silicon carbide can be transferred into the collection container 14. For example, the scraper 38 may be disposed adjacent to the opening 30 configured as an fall in opening of the collection container 14 such that the crystalline silicon carbide removed from the substrate 26 falls into the collection container 14.

Moreover, material locks 40, 42 are shown which enable the removal of solids from the collection container 14 or from the reactor 12. For example, the material locks 40, 42 each include one or according to FIG. 1 two slide elements 41, 41'; 43, 43' which may be controlled for instance by compressed air.

Thus, with an above described device 10 it is enabled that by means of the supply means 22, for example with the aid of a commercial powder conveyor, the precursor material is introduced, for example blown, into the reaction chamber 13 of the reactor 12 together with argon or nitrogen. This is preferably done intermittently. The precursor is partially gasified directly upon entering the hot protective gas-filled cylinder or, if it consists of larger precursor particles, is slowly passed into the gas phase on the gasification plate 23. From the gas phase SiC fibers grow at the bottom of the substrate 26 configured as a disc substrate 26 above the cylinder or reactor 12 just described in a temperature gradient which results from the effect of the tempering means 24, 36. In order to be able to set the temperature gradient reproducible and accurate, the substrate 26 is heated from above by the tempering means 36 in the area of the reactor 12.

The fibers adhering to the rotating disc are conveyed from the place of origin to the collection container 14 and are removed there from the rotating disc or the substrate 26 by means of the scraper 38. The fibers fall in the underlying collection container 14 and can be unloaded via the material lock 42 without the need for interrupting or compromising the operation and the fiber growth. Moreover, excess or unreacted precursor material can be removed from the reactor 12 via the material lock 40.

In the following, an exemplary method is described by means of which silicon carbide may be produced as nanocrystalline fibers by use of the above described device.

EXAMPLE

In the following the chemical composition and the sol-gel processing with different drying steps at 70° C. to 200° C. with subsequent extraction of solid granules comprising silicon and carbon at 1000° C. in order to obtain a precursor mixture which comprises a carbon source and a silicon source and is adapted to be introduced into the reactor 12 are described. Then the production of nanocrystalline fibers of silicon carbide based on the solid granules previously prepared is described.

Liquid sugar, tetraethylorthosilicate and ethanol are mixed to form a sol and gelled at 60-70° C. under exclusion of air. The composition for a formulation was (a) a colloidal suspension of 135 g of tetraethylorthosilicate (TEOS) dissolved in 168.7 g ethanol as a silicon source and (b) a solution of 68 g of saccharose as a carbon source in 75 g of distilled water, to which 37.15 g hydrochloric acid (HCl) is added as a catalyst for forming invert sugar. Subsequently, solution (a) with the liquid sugar (b) was mixed under stirring. Alternatively, instead of the solution (b) liquid sugar (invert sugar, 122 g 70%) can be used directly. Then, no water and only very little hydrochloric acid (5.2 g) are added, since they are only required for starting the gelling process. This sol is aged at 50° C. and then dried at 150-200° C.

For the production of SiC fibers preferably coarser granulate is required (some 10 μm) so that during the aging and/or the drying temporarily stirring takes place. This granulate or powder is freed of remaining unwanted reaction products at 1000° C. in a nitrogen or argon gas stream and finally ground, if necessary.

Furthermore, a modification of the SiC precursor for the purpose of doping of SiC nanofibers can be carried out. An n-type doping may be carried out, for example, with nitrogen (exemplary additives: nitric acid, ammonium chloride, potassium nitrate or melamine), or with phosphorus (exemplary additives: potassium dihydrogen phosphate or disodium hydrogen phosphate). A p-type doping can be carried out, for example, with boron (exemplary additive: Disodium tetraborate) or with aluminum (exemplary additive: aluminum powder). The dopants may be added to the above sol, the amounts are dependent upon the specific additive and the desired doping concentration.

The above-described powder can serve as a precursor mixture which subsequently is reacted in the reactor 12 to silicon carbide.

The reactor 12 is heated to a temperature of 1800° C. in the precursor gasification zone or in the reaction zone 13. The substrate 26 is operated at a temperature of 1750° C. The rotation time of the substrate 26 formed as a disc substrate is chosen so that it reaches a full revolution in 4 hours. By use of the supply means 22 leading into the reactor 12 configured as a cylinder an amount of 30 g of the above described produced precursor is blown into the reactor 12 or the reaction chamber 13 via a powder feeder with argon gas support. This is repeated at intervals of 15 minutes. The precursor granulate used has a grain size of 10 to 60 μm. With the selected parameters 3C—SiC nano fibers with diameters of less than 100 nm and lengths of 15 to 20 mm are formed. The grown fibers are collected in the collection container 14 via the scraper 38 and unloaded via the material lock 42 for example after 24 hours without interrupting the process. There is the possibility to empty the produced fibers for example via a gas system into a protection gas-filled or an evacuated container, whereby a contamination of the fibers is excluded. Via the material lock 40 non-gasified precursor granulate can be extracted from the reactor 12. Both means (collection container 14 and reactor 12) are configured such that a material extraction is usually necessary only after 4 to 6 days. Larger fiber diameters are obtained at higher reaction temperatures, e.g. 1850° C. in the gasification chamber and 1800° C. on the substrate 26.

Lower rotational speeds lead to a greater dwell time of the growing fibers in the reactor 12 and result in longer fibers.

The invention claimed is:

1. Device for continuously producing crystalline silicon carbide, comprising:
   a reactor; and
   a collection container at least partially spatially separated from the reactor, wherein
   the reactor comprises a supply means for supplying a precursor mixture,
   a substrate for depositing crystalline silicon carbide is provided,
   a reaction chamber of the reactor can be tempered to a first temperature $T_1$ and the substrate can be tempered to a second temperature $T_2$ which is different from the first temperature $T_1$, wherein the reactor can be heated to a temperature in a range of ≥1400° C. to ≤2000° C., and wherein the temperature of the substrate can be reduced by a temperature in a range of ≥50° C. to ≤100° C. compared to the temperature basically set in the reactor within the aforementioned range of ≥1400° C. to ≤2000° C., wherein a first tempering means for tempering the reactor is provided and further a second tempering means for tempering the substrate is provided, wherein the first tempering means for tempering the reactor and the second tempering means for tempering the substrate are controllable separately from each other, wherein the second tempering means includes a heating element for heating the substrate, wherein
   the substrate for the deposition of crystalline silicon carbide can be disposed at a deposition position within or adjacent to the reaction chamber and at least area-wise be moved from the deposition position to the collection container, and wherein
   a scraper is arranged such that after or during an at least area-wise movement of the substrate to the collection container crystalline silicon carbide deposited on the substrate can be removed by the scraper from the substrate and the removed crystalline silicon carbide can be transferred into the collection container.

2. Device according to claim 1, wherein the substrate is configured as a rotatable disc.

3. Device according to claim 1, wherein the scraper is disposed adjacent to a fall in opening of the collection container such that the crystalline silicon carbide removed from the substrate falls into the collection container.

4. Device according to claim 1, wherein the reactor and the collection container are constructed as top-side open containers, wherein the substrate can be disposed above top-side openings of the reactor and the collection container.

5. Device according to claim 1, wherein a wall of the reactor comprises graphite.

6. Device according to claim 5, wherein the wall of the reactor is at least partially constructed of a wound graphite foil.

7. Device according to claim 1, wherein the scraper is at least partially constructed from silicon carbide.

8. Device according to claim 1, wherein the collection container and the reactor each have a material lock for discharging a solid material.

9. Method for producing crystalline silicon carbide by use of a device, comprising the steps of:
   a) introducing a precursor mixture with a silicon source, a carbon source and optionally a doping agent into the reactor;
   b) exposing the precursor mixture provided in step a) to a gasification temperature in the reactor, wherein the gasification temperature is set by heating the reactor to a temperature lying in the range of ≥1400° C. to ≤2000° C.;
   c) depositing crystalline silicon carbide at the substrate by adjusting a crystallization temperature at the substrate, wherein the crystallization temperature is set by tempering the substrate to a temperature in a range of ≥50° C. to ≤100° C. below the temperature basically set in the reactor within the aforementioned range of ≥1400° C. to ≤2000° C.;
   d) moving the substrate to the scraper; and
   e) transferring the silicon carbide produced into the collection container by removing the produced silicon carbide from the substrate by moving the substrate along the scraper.

* * * * *